(12) United States Patent
Ki

(10) Patent No.: US 6,689,520 B2
(45) Date of Patent: Feb. 10, 2004

(54) EXPOSURE METHOD FOR CORRECTING DIMENSION VARIATION IN ELECTRON BEAM LITHOGRAPHY

(75) Inventor: Won-tai Ki, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/080,032

(22) Filed: Feb. 21, 2002

(65) Prior Publication Data

US 2003/0027064 A1 Feb. 6, 2003

(30) Foreign Application Priority Data

Jul. 21, 2001 (KR) .......................... 2001-44066

(51) Int. Cl.[7] .............................. G03F 9/00; G03C 5/00
(52) U.S. Cl. ............................ 430/30; 430/5; 430/296; 430/942
(58) Field of Search .............................. 430/5, 30, 296, 430/942

(56) References Cited

U.S. PATENT DOCUMENTS 6,298,473 B1 10/2001 Ono et al. ..................... 716/21

*Primary Examiner*—Christopher G. Young
(74) *Attorney, Agent, or Firm*—Mills & Onello LLP

(57) ABSTRACT

An exposure method for correcting dimension variations in a pattern resulting from the fogging effect occurring during electron beam exposure and/or the loading effect occurring during dry etching, and a recording medium for recording the same are provided. According to the exposure method, dimension variations can be minimized by calculating the loading effect and/or fogging effect causing dimension variations in a pattern, correcting mask pattern dimension data in advance based on a calculated result and making exposure according to the corrected pattern data. Further, the loading effect and/or fogging effect can be easily calculated because the above-described method can be realized as a computer program and the computer program can be included in an exposure tool, thereby enabling exposure based on a corrected value.

16 Claims, 3 Drawing Sheets

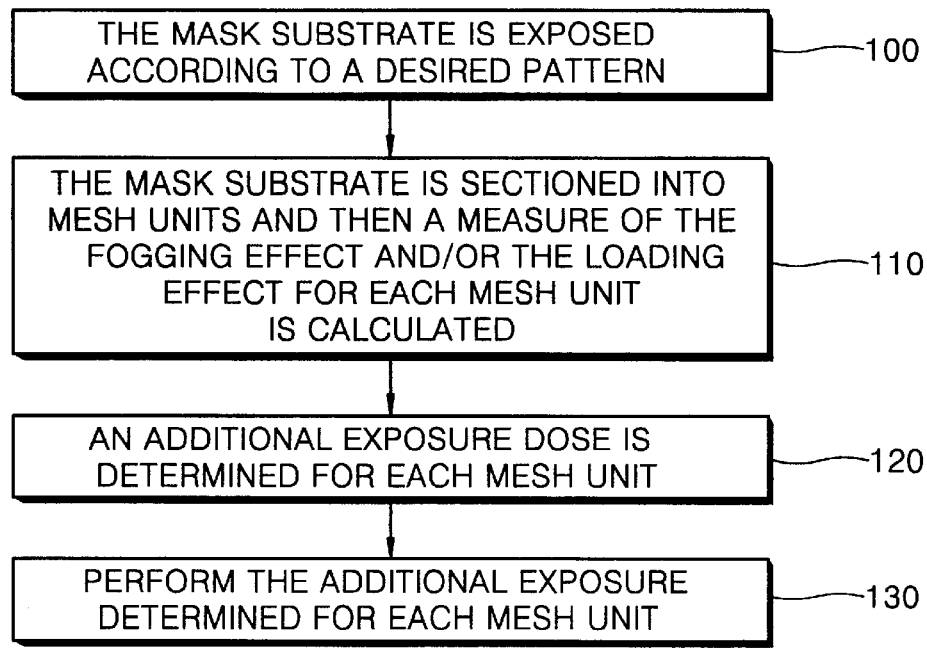
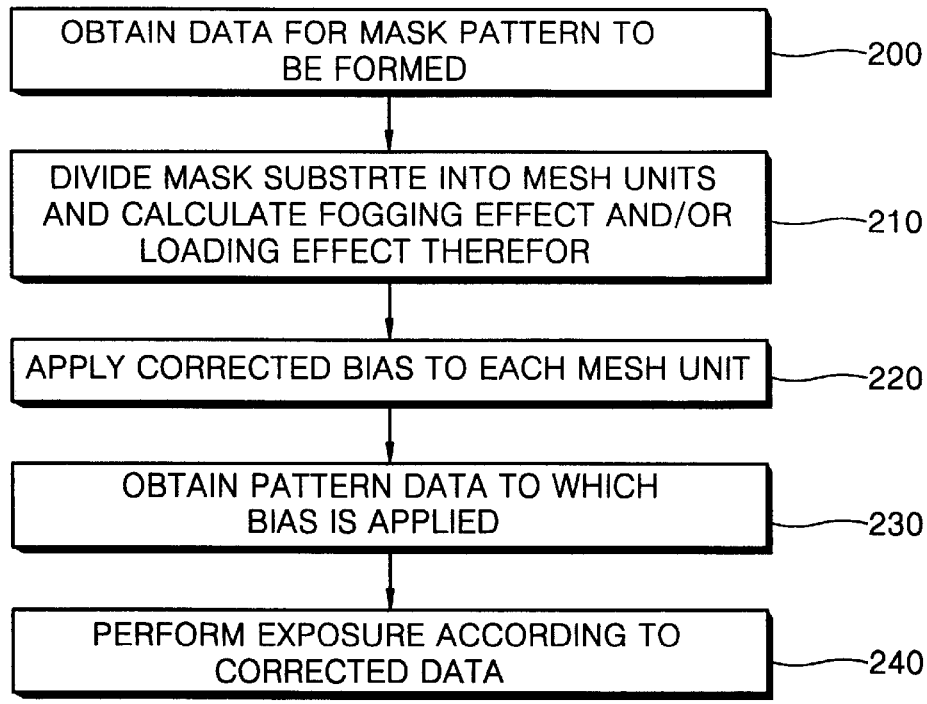

EXPOSURE METHOD FOR CORRECTING DIMENSION VARIATION IN ELECTRON BEAM LITHOGRAPHY

BACKGROUND OF THE INVENTION

1. Field of the Invention

The present invention relates to electron beam lithography used when fabricating a semiconductor device, and more particularly, to an exposure method for correcting dimension variations in a pattern due to an electron beam rescattering effect occurring during electron beam exposure (hereinafter, "fogging effect") and/or a loading effect, and a medium for recording the same.

2. Description of the Related Art

Electron beam lithography is used when forming an opaque layer on a mask substrate and patterning the opaque layer to have a desired pattern. In electron beam lithography, an electron beam resist is applied to the opaque layer, and a desired pattern is exposed to an electron beam and developed. Then, the opaque layer is etched using the electron beam resist pattern as a mask.

In general, the electron beam not only exposes a desired portion of the electron beam resist, but also is scattered, being reflected from the surface of the opaque layer, from the surface or the inside of the electron beam resist, or from a lower part of an object lens of an electron beam illuminator, or colliding with electrons of the electron beam resist, thereby exposing an undesired portion of the electron beam resist. Such scattered exposure results in a change in a critical dimension (CD) of a pattern. A change in the critical dimension of a pattern that is caused by exposure due to the electron beam being reflected from the surface or the inside of the electron beam resist or from the object lens of the electron beam illuminator is called a "re-scattering effect" or "fogging effect."

Also, the critical dimension of a pattern changes when the opaque layer is dry-etched using the electron beam resist pattern as a mask after the development of the electron beam resist. This is called a "loading effect." The density of area from which electron beam resist film is removed and lower opaque layer is exposed within a given area of the mask substrate is called "loading density." The critical dimension of a portion having large loading density is larger than that of a portion having small loading density.

The fogging effect and the loading effect have been corrected by controlling exposure dose through additional exposure. FIG. 1 is a block diagram of an exposure method for correcting critical dimension variation of a pattern which has been commonly used. Referring to FIG. 1, a mask substrate is exposed according to a desired pattern (100). The mask substrate on which the pattern is formed is sectioned into mesh units and then L, a measure of the fogging effect and/or the loading effect, is calculated for each mesh unit with the following expression (1) (110). Additional exposure dose is determined referring to an L value calculated for the respective mesh units (120). Additional exposure dose must be comparatively increased for a mesh unit having a small L value and be comparatively decreased for a mesh unit having a large L value (130).

$$L(x, y) = \sum_{i,j} D(i, j)\exp\left[-\frac{(x-i)^2 + (y-j)^2}{\delta^2}\right] \quad (1)$$

wherein x and y are coordinates of a mesh unit to be estimated and D (i,j) is exposure pattern density within the mesh unit whose coordinates are (i, j).

The effectiveness of the above method of correcting the critical dimension of a pattern has proven to be excellent. Nonetheless, the method has at least two drawbacks. Firstly, a throughput loss is incurred due to the additional exposure. Although the amount of a loss is different according to types of exposure tools, an additional exposure causes a delay in process time of roughly twenty minutes to one hour per mask.

Secondly, the critical dimension of a pattern is difficult to precisely correct because there are ten additional exposure stages needed for correction even in making a correction pattern and controlling exposure dose by defocusing an electron beam. In each stage, the amount of critical dimension correction is only approximately 3–4 nm.

SUMMARY OF THE INVENTION

To solve the above problems, it is an objective of the present invention to provide a correction exposure method for precisely correcting dimensional variations in a pattern due to the fogging effect and loading effect without a loss in throughput during electron beam exposure.

In accordance with the invention, there is provided an exposure method for correcting dimension variations in a pattern formed on a mask substrate during electron beam lithography. In the method, the mask substrate having a pattern is divided into mesh units and an L value for each mesh unit is calculated using the following formula:

$$L(x, y) = \sum_{i,j} D(i, j)\exp\left[-\frac{(x-i)^2 + (y-j)^2}{\delta^2}\right]$$

where x and y are coordinates of a mesh unit whose L value is to be calculated, and D(i,j) is an exposure pattern density within a mesh unit having the coordinates (i,j). Next, pattern dimension data regarding each mesh unit is corrected, so that dimensions for a mesh unit having a small L value become larger and dimensions for a region having a large L value become smaller. Then, the corrected pattern dimension data for each mesh unit is applied to an exposure tool.

Pattern dimension data is corrected by experimentally calculating the range of dimensional variations according to L for each mesh unit. Then, pattern dimensions in a mesh unit having a small L value are corrected by applying +bias to pattern dimension data of the mesh unit to increase the pattern dimension, and pattern dimensions in a mesh unit having a large L value are corrected by applying −bias to pattern dimension data of the mesh unit to decrease the pattern dimension,
wherein:

+bias=(L−L$_{min}$)*dimension variation range, and

−bias=(L$_{max}$−L)*dimension variation range, wherein L$_{max}$ is a maximum value of L calculated and L$_{min}$ is a minimum value of L calculated.

The above correction method can be used in correcting dimension variations in a pattern formed on a mask substrate due to the loading effect or fogging effect. Further, it can be used in correcting dimension variations in a pattern due to the loading effect and the fogging effect. The values L and D can denote a loading effect and a loading density, respectively. Alternatively, the values L and D can denote a fogging effect and an exposure pattern density, respectively. Alternatively, the value L can denote a combined value of a fogging effect and a loading effect, and the value D can denote an exposure pattern density.

To achieve the objective, there is also provided a recording medium on which a computer program for performing the above exposure method is recorded and which is readable by a computer. The recording medium includes a program module for dividing the mask substrate having the pattern into mesh units and calculating L for each mesh unit using the following expression:

$$L(x, y) = \sum_{i,j} D(i, j) \exp\left[-\frac{(x-i)^2 + (y-j)^2}{\delta^2}\right]$$

wherein x and y are coordinates of a mesh unit of a mesh for which L is to be calculated and D(i,j) is an exposure pattern density within a mesh unit having the coordinates (i,j). The recording medium also includes a program module for correcting pattern dimension data regarding each mesh unit so that pattern dimensions for a mesh unit having a small L value are increased and pattern dimensions for a mesh unit having a large L value are decreased, and a program module for applying corrected pattern dimension data for each mesh.

Through the program module for correcting pattern dimension data, the range of dimensional variations in a pattern can be experimentally calculated according to L for each mesh unit and pattern dimensions in a mesh unit having a small L can be corrected by applying +bias to pattern dimension data of the mesh unit to increase the pattern dimension, and pattern dimensions in a mesh unit having a large L can be corrected by applying −bias to pattern dimension data of the mesh unit to decrease the pattern dimension,
wherein:
  +bias=(L−$L_{min}$)*dimension variation range, and
  −bias=($L_{max}$−L)*dimension variation range,
wherein $L_{max}$ is a maximum value of L calculated and $L_{min}$ is a minimum value of L calculated.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 1 is a block diagram of a correction exposure process according to a conventional method.

FIG. 2 is a block diagram of a correction exposure process according to the present invention.

DETAILED DESCRIPTION OF THE INVENTION

FIG. 2 is a block diagram illustrating a method of correcting dimension variations of a pattern and performing exposure based on a correction result according to process order as a preferred embodiment of the present invention. Referring to FIG. 2, data needed for a mask pattern to be formed is obtained (200), but it is not input to an exposure tool at this time. A mask substrate is divided into mesh units, exposure pattern density for each mesh unit is calculated and a measure L of the loading or fogging effect for the respective mesh unit is obtained using expression (1) (210).

L may represent the loading effect or the fogging effect, or both the loading effect and the fogging effect. However, in any case, L is calculated through the same expression. Expression (1) will be described with respect to the loading effect here.

The magnitude of the loading effect that a predetermined point of the mask substrate receives from patterns formed at every point on the mask substrate decreases exponentially as distance increases. Therefore, the loading effect frequency $f_L$ representing the degree of loading effect can be quantified with a loading effect frequency $f_L$ having a gaussian distribution and expressed as follows:

$$f_L(r) = \frac{k}{\pi\delta^2}\exp\left[-\frac{r^2}{\delta^2}\right] \quad (2)$$

wherein x and y are coordinates of a predetermined point on the mask substrate, k is a loading constant, r is a distance between the predetermined point and another point on the mask substrate and δ is a range of the loading effect.

Figure 3:
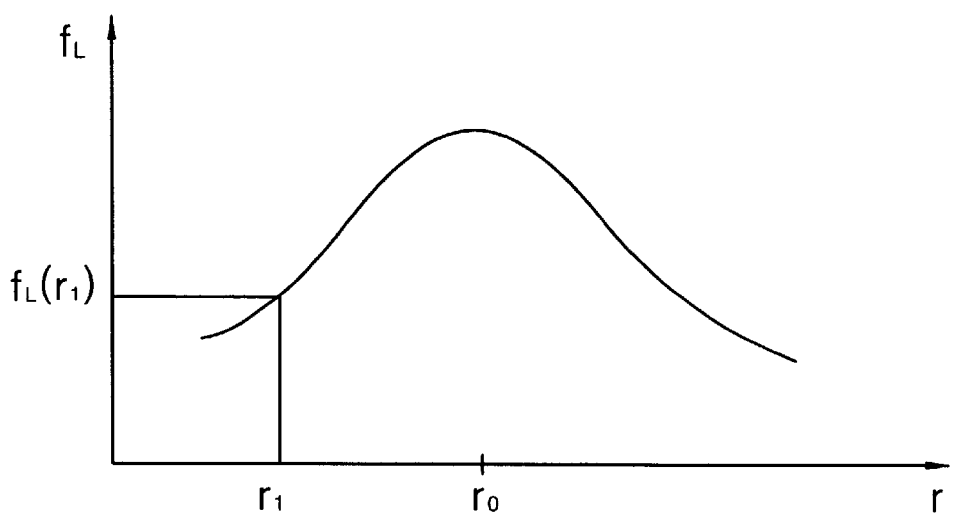
FIG. 3 is a graph illustrating loading effect frequency $f_L$ versus distance r.

FIG. 3 is a graph of the loading effect frequency presented in expression (2) versus a distance from a predetermined point on the mask substrate.

Referring to FIG. 3, expression (2) is understood as $f_L(r_1)$, is a loading effect frequency at a predetermined point $r_0$ due to another point $r_1$. The loading effect that predetermined point $r_0$ receives from another point $r_1$ decreases as the distance between the predetermined point $r_0$ and the other point $r_1$ increases. The loading effect range δ is a mathematical distance rather than a physical distance as described above.

Accordingly, the influence of the loading effect at a specific point on the mask substrate according to a pattern formed at another point on the mask substrate is proportional to the product of the loading density at the other point and the loading effect frequency from the other point to the specific point. For this reason, the influence of the loading effect at the specific point due to every point on the mask substrate can be indicated as convolution of the loading density and the loading effect frequency at every point. In the case that the photo mask substrate is divided into mesh units, the loading effect frequency is calculated with expression (1).

In addition, a method of calculating the fogging effect index can be expressed numerically with expression (1) as described above.

After calculating the loading effect and/or fogging effect, the range of dimension variations in a pattern according to L for each mesh unit is experimentally obtained. At this time, pattern dimensions must be corrected by applying +bias to pattern dimension data corresponding to mesh units having small L to increase the pattern dimension and be corrected by applying −bias to pattern dimension data corresponding to mesh units having large L (220) to decrease the pattern dimension, where:
  +bias=(L−$L_{min}$)*dimension variation range, and
  −bias=($L_{max}$−L)*dimension variation range,
wherein $L_{max}$ is a maximum value of L calculated and $L_{min}$ is a minimum value of L calculated.

Figure 4:
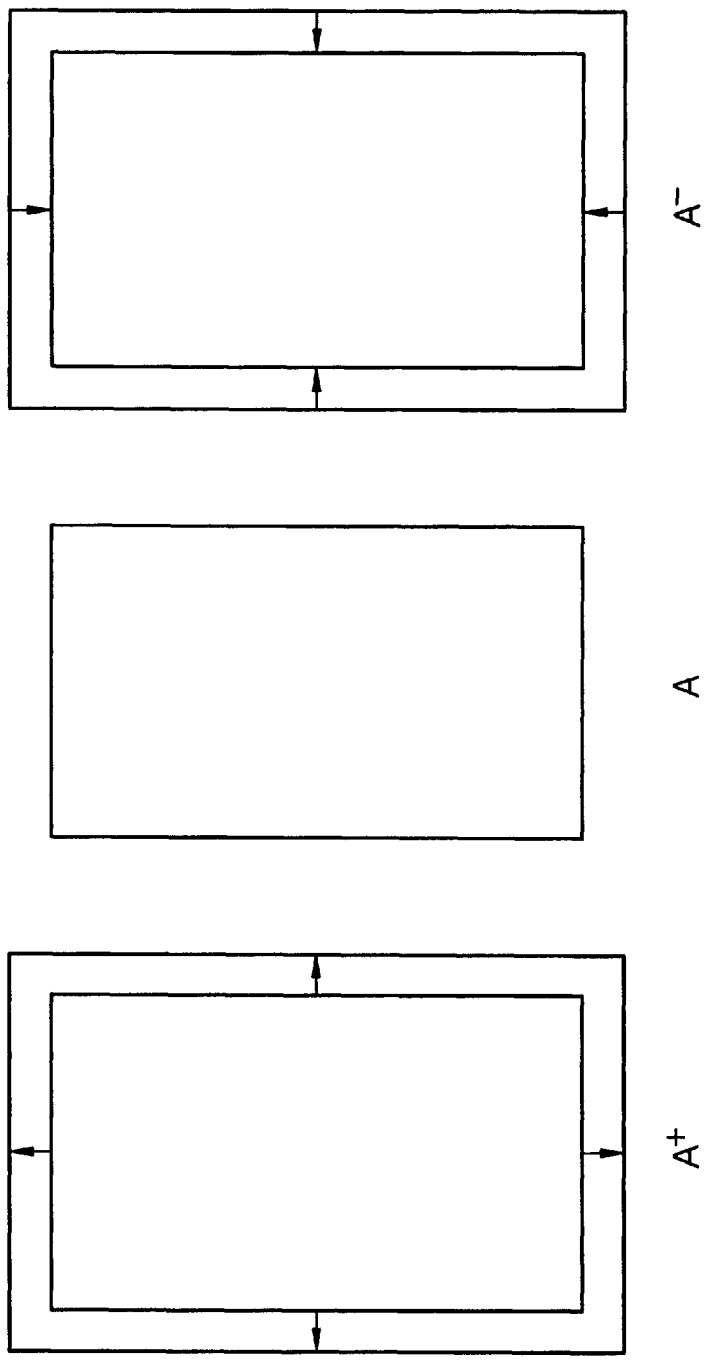
FIG. 4 is a drawing illustrating correction of critical dimension of a pattern by applying a bias thereto.

FIG. 4 is a drawing illustrating critical dimension of a pattern corrected by applying a bias thereto. In FIG. 4, a rectangle indicated as A denotes an original pattern in which no loading effect nor fogging effect occurs. A rectangle indicated as A⁺ denotes a pattern to which +bias is applied, that is, a pattern of a region having a small L value wherein dimension correction is rendered by expanding the dimensions of the original pattern. Also, a rectangle indicated as A⁻ denotes a pattern to which −bias is applied, that is, a pattern of a region having a large L value in which dimension correction is made by reducing the dimensions of the original pattern (230).

Pattern data corrected by applying bias thereto is input to an exposure tool and exposure is then performed according to the corrected pattern data (240).

The above-described method for correcting dimension variations occurring in the electron beam lithography according to the present invention can be embodied as a computer program, which can be stored on a recording medium readable by a computer. Also, the recording medium can be read by a general-purpose digital computer and therefore, the present invention can be more easily accomplished through a digital computer attached to an exposure tool. Here, the recording medium includes magnetic recording media such as ROM, floppy discs and hard discs, optical recording media such as CDs and DVDs, and storage media such as a carrier wave which transmits data through the Internet.

In the recording medium, several program modules for each of a plurality of mesh units which are divisions of the mask substrate having a pattern are recorded, e.g., each program module for calculating the loading effect and/or fogging effect for a respective mesh unit using expression (1), a program module for correcting pattern dimension data corresponding to mesh units having small L values to increase the pattern dimension and correcting pattern dimension data corresponding to mesh units having large L values to decrease the pattern dimension, and a program module for applying corrected data to an exposure tool. The recording medium may be included in a computer which operates the exposure tool and it is thus possible to operate the exposure tool according to information recorded on the recording medium.

As described above, according to the present invention, dimension variations can be minimized by calculating the loading effect and/or fogging effect causing dimension variations in a pattern, correcting mask pattern dimension data in advance based on a calculated result and making exposure according to the corrected pattern data.

Further, the loading effect and/or fogging effect can be readily calculated because the above-described method can be realized as a computer program and the computer program can be included in an exposure tool, thereby enabling easy exposure based on a corrected value.

While the present invention has been particularly shown and described with reference to the preferred embodiment thereof, it will be understood by those skilled in the art that various changes in form and details may be made thereto without departing from the spirit and scope of the invention as defined by the appended claims.

What is claimed is:

1. An exposure method for correcting dimension variations in a pattern formed on a mask substrate during electron beam lithography, the method comprising the steps of:

dividing the mask substrate having a pattern into mesh units and calculating an L value for each mesh unit using the formula:

$$L(x, y) = \sum_{i,j} D(i, j) \exp\left[-\frac{(x-i)^2 + (y-j)^2}{\delta^2}\right]$$

where x and y are coordinates of a mesh unit whose L value is to be calculated, and D(i,j) is an exposure pattern density within a mesh unit having the coordinates (i,j), and δ is a range of a loading effect;

correcting pattern dimension data regarding each mesh unit, so that dimensions for a mesh unit having a small L value become larger and dimensions for a region having a large L value become smaller; and applying the corrected pattern dimension data for each mesh unit to an exposure tool.

2. The exposure method of claim 1, wherein L and D denote the loading effect and a loading density, respectively.

3. The exposure method of claim 1, wherein L and D denote a fogging effect and an exposure pattern density, respectively.

4. The exposure method of claim 1, wherein L denotes a combined value of a fogging effect and the loading effect and D denotes an exposure pattern density.

5. The exposure method of claim 1 wherein the step of correcting pattern dimension data comprises the steps of:

experimentally calculating the range of dimensional variations according to L for each mesh unit; and correcting pattern dimensions in a mesh unit having a small L value by applying +bias to pattern dimension data of the mesh unit to increase the pattern dimension, and correcting pattern dimensions in a mesh unit having a large L value by applying −bias to pattern dimension data of the mesh unit to decrease the pattern dimension, wherein:

+bias=(L−$L_{min}$)*dimension variation range, and

−bias=($L_{max}$−L)*dimension variation range, wherein $L_{max}$ is a maximum value of L calculated and $L_{min}$ is a minimum value of L calculated.

6. The exposure method of claim 2 wherein the step of correcting pattern dimension data comprises the steps of:

experimentally calculating the range of dimensional variations according to L for each mesh unit; and correcting pattern dimensions in a mesh unit having a small L value by applying +bias to pattern dimension data of the mesh unit to increase the pattern dimension, and correcting pattern dimensions in a mesh unit having a large L value by applying −bias to pattern dimension data of the mesh unit to decrease the pattern dimension, wherein:

+bias=(L−$L_{min}$)*dimension variation range, and

−bias=($L_{max}$−L)*dimension variation range, wherein $L_{max}$ is a maximum value of L calculated and $L_{min}$ is a minimum value of L calculated.

7. The exposure method of claim 3 wherein the step of correcting pattern dimension data comprises the steps of:

experimentally calculating the range of dimensional variations according to L for each mesh unit; and correcting pattern dimensions in a mesh unit having a small L value by applying +bias to pattern dimension data of the mesh unit to increase the pattern dimension, and correcting pattern dimensions in a mesh unit having a large L value by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

8. The exposure method of claim 4 wherein the step of correcting pattern dimension data comprises the steps of:

experimentally calculating the range of dimensional variations according to L for each mesh unit; and correcting pattern dimensions in a mesh unit having a small L value by applying +bias to pattern dimension data of the mesh unit to increase the pattern dimension, and correcting pattern dimensions in a mesh unit having a large L value by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

9. A recording medium on which a computer program for performing an exposure method for correcting dimensional variations in a pattern formed on a mask substrate during electron beam lithography is recorded, the recording medium being readable by a computer and comprising:

a program module for dividing the mask substrate having the pattern into mesh units and calculating L for each mesh unit using the following expression:

$$L(x, y) = \sum_{i,j} D(i, j) \exp\left[-\frac{(x-i)^2 + (y-j)^2}{\delta^2}\right]$$

wherein x and y are coordinates of a mesh unit of a mesh for which L is to be calculated and D(i,j) is an exposure pattern density within a mesh unit having the coordinates (i,j), and δ a range of a loading effect;

a program module for correcting pattern dimension data regarding each mesh unit so that pattern dimensions for a mesh unit having a small L value are increased and pattern dimensions for a mesh unit having a large L value are decreased; and a program module for applying corrected pattern dimension data for each mesh.

10. The recording medium of claim 9, wherein L and D denote a loading effect and a loading density, respectively.

11. The recording medium of claim 9, wherein L and D denote a fogging effect and an exposure pattern density, respectively.

12. The recording medium of claim 9, wherein L denotes a combined value of a fogging effect and the loading effect and D denotes an exposure pattern density.

13. The recording medium of claim 9, wherein the step of correcting pattern dimension data comprises the steps of:

experimentally calculating the range of dimensional variations in a pattern according to L for each mesh unit; and correcting pattern dimensions in a mesh unit having a small L by applying +bias to pattern dimension data of the mesh unit to increase the pattern dimension, and correcting pattern dimensions in a mesh unit having a large L by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

14. The recording medium of claim 10, wherein the step of correcting pattern dimension data comprises the steps of:

experimentally calculating the range of dimensional variations in a pattern according to L for each mesh unit; and correcting pattern dimensions in a mesh unit having a small L by applying +bias to pattern dimension data of the mesh unit to increase the pattern dimension, and correcting pattern dimensions in a mesh unit having a large L by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

15. The recording medium of claim 11, wherein the step of correcting pattern dimension data comprises the steps of:

experimentally calculating the range of dimensional variations in a pattern according to L for each mesh unit; and correcting pattern dimensions in a mesh unit having a small L by applying +bias to pattern dimension data of the mesh unit to increase the pattern dimension, and correcting pattern dimensions in a mesh unit having a large L by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

16. The recording medium of claim 12, wherein the step of correcting pattern dimension data comprises the steps of:

experimentally calculating the range of dimensional variations in a pattern according to L for each mesh unit; and correcting pattern dimensions in a mesh unit having a small L by applying +bias to pattern dimension data of the mesh unit to increase the pattern dimension, and correcting pattern dimensions in a mesh unit having a large L by applying −bias to pattern dimension data of the mesh unit to decrease the pattern dimension, wherein:

+bias=$(L-L_{min})$*dimension variation range, and

−bias=$(L_{max}-L)$*dimension variation range, wherein $L_{max}$ is a maximum value of L calculated and $L_{min}$ is a minimum value of L calculated.

* * * * *

UNITED STATES PATENT AND TRADEMARK OFFICE
CERTIFICATE OF CORRECTION

PATENT NO. : 6,689,520 B2
DATED : February 10, 2004
INVENTOR(S) : Won-tai Ki

It is certified that error appears in the above-identified patent and that said Letters Patent is hereby corrected as shown below:

Title page,
Item [54], Title, please insert --, AND RECORDING MEDIUM FOR RECORDING THE SAME -- after "LITHOGRAPHY".

Column 7,
Line 39, please insert -- is -- after "and δ".

Signed and Sealed this

Twenty-first Day of June, 2005

JON W. DUDAS
*Director of the United States Patent and Trademark Office*